United States Patent
Spinner

(10) Patent No.: US 7,624,379 B2
(45) Date of Patent: Nov. 24, 2009

(54) TEST PROGRAM SET OBSOLESCENCE MITIGATION THROUGH SOFTWARE AND AUTOMATIC TEST EQUIPMENT SYSTEM PROCESSES

(75) Inventor: Robert Spinner, East Northport, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 751 days.

(21) Appl. No.: 11/330,702

(22) Filed: Jan. 12, 2006

(65) Prior Publication Data

US 2006/0156289 A1 Jul. 13, 2006

Related U.S. Application Data

(60) Provisional application No. 60/643,248, filed on Jan. 12, 2005.

(51) Int. Cl.
*G06F 9/44* (2006.01)
*G06F 9/45* (2006.01)

(52) U.S. Cl. .................. 717/124; 717/128; 717/129

(58) Field of Classification Search .......... 717/124–130
See application file for complete search history.

(56) References Cited

U.S. PATENT DOCUMENTS

| | | | | |
|---|---|---|---|---|
| 4,630,224 A | | 12/1986 | Sollman | |
| 5,046,033 A | * | 9/1991 | Andreasen et al. | 702/119 |
| 5,136,705 A | * | 8/1992 | Stubbs et al. | 714/27 |
| 5,703,788 A | * | 12/1997 | Shei et al. | 716/4 |
| 5,717,928 A | * | 2/1998 | Campmas et al. | 716/17 |
| 5,936,868 A | * | 8/1999 | Hall | 716/4 |
| 6,332,211 B1 | * | 12/2001 | Pavela | 717/130 |
| 6,421,822 B1 | * | 7/2002 | Pavela | 717/125 |
| 6,523,151 B2 | * | 2/2003 | Hekmatpour | 716/4 |
| 6,654,950 B1 | * | 11/2003 | Barnishan | 717/136 |
| 6,862,711 B1 | * | 3/2005 | Bahrs et al. | 715/205 |
| 6,944,848 B2 | * | 9/2005 | Hartman et al. | 717/124 |

(Continued)

FOREIGN PATENT DOCUMENTS

GB  2150696  7/1985

OTHER PUBLICATIONS

Harman et al ,"Auromated test data generation for aspect oriented programs", ACM AOSD, pp. 185-196, 2009.*
Sepulveda et al, "Implemenating the high level architecture in the virtual test bed", ACM, pp. 1444-1451, 2004.*
Liu et al, "A unified fitness function calculation rule for flag conditions to improve evolutionary testing", ACM ASE, pp. 337-341, 2005.*

(Continued)

*Primary Examiner*—Anil Khatri
(74) *Attorney, Agent, or Firm*—Brian Roffe

(57) ABSTRACT

Electronic test system including hardware and software components and method of use of same which provide obsolescence mitigation. A set of governing rules for the system is defined and a test program test (TPS) is created to enable units to be tested. When a new component is introduced into the system, the change is detected and a new TPS is created. If the new TPS complies with the rules, testing using the new TPS is possible. If not, a determination is made as to whether any component of the TPS is obsolete and if not, the units can be tested using the new TPS without redefining the rules. When a component of the TPS is obsolete, the rules are reviewed to ascertain the effect of the removal of the component and optionally redefined to enable the new component to be used in combination with the remaining components.

19 Claims, 2 Drawing Sheets

U.S. PATENT DOCUMENTS

| | | | |
|---|---|---|---|
| 7,047,442 B2 * | 5/2006 | Sutton | 714/25 |
| 7,197,417 B2 * | 3/2007 | Pramanick et al. | 702/119 |
| 7,363,614 B2 * | 4/2008 | Kageyama et al. | 717/124 |
| 7,389,223 B2 * | 6/2008 | Atkin et al. | 704/8 |
| 7,464,372 B2 * | 12/2008 | Achlioptas et al. | 717/124 |
| 7,584,455 B2 * | 9/2009 | Ball | 717/124 |
| 7,587,636 B2 * | 9/2009 | Tillmann et al. | 714/33 |

OTHER PUBLICATIONS

Moradi et al, "An agent based environment for simulation model composition", IEEE, pp. 175-184, 2008.*

Search report from UK patent application No. GB 0600570.6 dated Apr. 21, 2006.

* cited by examiner

TEST PROGRAM SET OBSOLESCENCE MITIGATION THROUGH SOFTWARE AND AUTOMATIC TEST EQUIPMENT SYSTEM PROCESSES

CROSS-REFERENCE TO RELATED APPLICATION

This application claims priority under 35 U.S.C. §119(e) of U.S. provisional patent application Ser. No. 60/643,248 filed Jan. 12, 2005, now expired, which is incorporated by reference herein.

FIELD OF THE INVENTION

The present invention relates generally to methods and systems for obsolescence mitigation of electronic systems including hardware and software components and more particularly to methods and systems for dealing with obsolete hardware and software in automated test systems to enable transparent updating of the automated test systems and applications.

The present invention also relates generally to methods and systems for performing production, functional and diagnostic tests using automated test systems and subsystems to enable subsequent repair to serviceable status of the systems and subsystems, or to certify functional readiness of the systems and subsystems for insertion thereof into a larger functional assembly.

BACKGROUND OF THE INVENTION

Since the inception of automated test systems or automated test equipment, engineers have struggled with the dilemma of delivering a cost effective solution to provide optimum testing of electronic equipment. Throughout the endeavor, various systems have been put together which have an important common system, the Test Program Set (TPS). The common system or end application includes software (application test software), hardware and documentation relating to the operation of the hardware and software.

There have similarly been embodied in these systems a number of test standards, test methods and philosophies, test tools and the like, developed to deliver more cost effective solutions for single and multiple user environments. Early versions were typically company proprietary and often, no standard existed to guide interoperability of different products. Today's solutions leverage commercial technology and standards through the use of what is often termed open architecture. This is beneficial from the interoperability standpoint, but alone will not likely provide a cost effective solution.

A particular problem of using commercial technology and standards is the tendency or possibility for a single entity, usually the most deep-pocketed entity, to influence the commercial world in their favor. This typically causes the promise of cost savings, expected to be achieved using a commercial standard, to be eroded due to significant single entity influence. The initiation of a commercial standard through professional organizations such as the IEEE can take far too long and consequently, a technology can be obsolete before a use standard is complete.

Each end application test software system is developed for and on a respective test system and follows a specified method. The system of software, hardware and documentation the end application executes on, and is therefore supported by, is most notably referred to as an Automatic Test System (ATS). Depending on the end user, it is also commonly referred to as Automatic Test Equipment (ATE). For the purpose of the invention and this discussion, the term used will be GPATE, which stands for "general purpose automatic test equipment".

The test program set is a function embodied within both test station system software which is inclusive of test integration and development tools and the end item application software or automatic test program sets developed and integrated which execute or run as a function of the software utilizing integrated test equipment or instrumentation known as a family of testers which operates as scalable and reconfigurable GPATE.

The commercial and governmental sectors are similar competitive forces both fundamentally seeking cost effective GPATE solutions and the invention delivers elements of cost effectiveness most advantageous to each. Consider the typical governmental product life cycle and maintenance repair cycles are far longer than those in the commercial industry. Through this invention, the long term user benefits primarily on the protection of the investment in test and repair capability and will achieve a lower total cost of ownership for their extended product life cycles. The short term user benefit is, in the near real time, the adaptabilities the invention provides through component reuse and the natural extensibility of the system of systems.

Governmental entities exert tremendous leverage and thus directly influence the commercial world of GPATE. There exists a directive for the U.S. government to purchase DOD sponsored NxTest products or Commercial Off The Shelf (COTS) parts where available in theory because it is more competitive. This often causes ineffectual or outdated commercial standards to be prematurely introduced and inappropriately applied to test systems. This is not typically done out of technical naivety but rather to gain a competitive edge or win points in a competition for contracts and set up a buyer-beware type of dilemma for purchasers. This invention alleviates the negative effects of this phenomenon.

A second ineffectual practice is that each time a governmental entity releases a contract it purchases similar documents and controls pertinent but not very different from previous ones. This adds short and long term costs unnecessarily. Most importantly, it precludes the governmental entity from considering or establishing long term sustainment standards and practices appropriately and therefore lacks them. This is not recognized by any entity probably due to high personnel turn-over in key positions.

As discussed fully below, this is achieved by the invention through the adaptation of standards and adherence to natural technology boundaries within the system divisions. The ultimate isolation of the work value is least impacted when the end application software is independent of the ATS. Standards are often not completely adopted by all companies involved in the field in which the standard is applicable. Most companies only adopt what suits their immediate needs and rarely evaluate the long term impacts properly.

Ultimately, both the GPATE system and TPS system support the structured test sequences and diagnostic rational developed by the test engineer to achieve their goal. Traditionally, during this process, for each system of the software, hardware and documentation (hereinafter referred to as a "system of subsystems"), the subsystems are fundamentally tied together as a unified body of work, i.e., the "system". In traditional, competitive systems, the body of work is not itself a system within a larger system but rather a system on top of or existing simultaneous with a larger system.

In order to deliver the most cost effective solution in the long term, namely continuous transparent obsolescence, each unified body of work needs to be protected from obsolescence.

Also, although it might be thought that it would be obvious to protect each unified body of work from obsolescence, there is no known current system of subsystems which provides this capability. One reason this has not been achieved is because system integrators are lulled away from their standards by the promise of new technology or out of fear of missing the next best thing rather than figuring out how the next best thing fits into what they do. Thus, when new technology is available, the "old" technology is often discarded entirely without any attempt to integrate the new technology into the old, existing system so that at least part of the old system might be salvaged and used further.

Accordingly, the invention seeks to adopt what is reusable and can be replenished via multiple sources or can be duplicated in-house within the confines of the ATS and TPS boundaries.

OBJECTS AND SUMMARY OF THE INVENTION

It is an object of the present invention to provide new methods and systems for obsolescence mitigation of electronic systems including hardware and software components and more particularly to methods and systems for dealing with obsolete hardware and software in automated test systems to enable transparent updating of the automated test systems.

It is another object of the present invention to provide new methods and systems for performing production, functional and diagnostic tests of automated test systems and subsystems to enable subsequent repair to serviceable status of the systems and subsystems, or to certify functional readiness of the systems and subsystems for insertion thereof into a larger functional assembly.

It is yet another object of the present invention to provide a cost effective solution to the problem which arises when only some components within a system become obsolete and continued use of the system with newer components is desired.

In order to achieve these objects and others, a method for use of an electronic test system including hardware and software components while providing obsolescence mitigation comprises defining a set of governing rules for the system, creating a test program test (TPS) for the system such that units under test (UUTs) can be tested using the TPS, introducing a new component into the system, detecting a change in the system and then creating a new TPS, determining whether the new TPS complies with the rules and if so, enabling testing of units using the new TPS, and when the new TPS does not comply with the rules, determining whether any component of the TPS has been rendered obsolete and if not, enabling testing of the units using the new TPS without redefining the rules. When a component of the TPS has been rendered obsolete, the rules are reviewed to ascertain the effect of the removal of the component and optionally redefined to enable the new component to be used in combination with the remaining components in the system.

Since the rules are intended to be used over the entire life cycle of the system, a user of the system can be notified of a violation of the rules which might eliminate the transparent obsolescence mitigation. This is preferred in order to prevent a component from being introduced into the system which would destroy the ability of the system to be continually updated with new components while maintaining other components.

The component may be a hardware or software component and may reflect a new or emerging technological innovation or standard.

An electronic test system which provides for obsolescence mitigation in accordance with the invention includes hardware and software components selectively coupled together. That is, the software can be embodied on hardware components, e.g., memory components, connected to other hardware components using conventional cabling and wireless arrangements. The components enable creation of a test program test (TPS) for the system and testing of units using the TPS, e.g., by coupling the unit under test (UUT) to one of the hardware components using conventional cabling or wireless arrangements. The software detects a change in the system caused by introduction of a new component into the system, in a manner known to those skilled in the art, and then enables creation of a new TPS and determines whether the new TPS complies with a set of governing rules for the system. The new TPS can be created by a user of the electronic test system or automatically based on stored software programs. When the new TPS complies with the rules, the components can initiate testing of units using the new TPS, when such units are coupled to the electronic test system. When the new TPS does not comply with the rules, the software determines whether any component of the TPS has been rendered obsolete and if not, enables the components to initiate testing of the units using the new TPS without redefining the rules. On the other hand, when a component of the TPS has been rendered obsolete, the software and/or monitoring personnel can be notified in order to conduct a review of the rules to ascertain the effect of the removal of the component. Further, the method might entail redefining the rules to enable the new component to be used in combination with the remaining components in the system. The obsolescence mitigation technique repeats itself whenever a new component is introduced into the system.

BRIEF DESCRIPTION OF THE DRAWINGS

The following drawings are illustrative of embodiments of the invention and are not meant to limit the scope of the invention as encompassed by the claims.

DETAILED DESCRIPTION OF THE PREFERRED EMBODIMENTS

Figure 1:
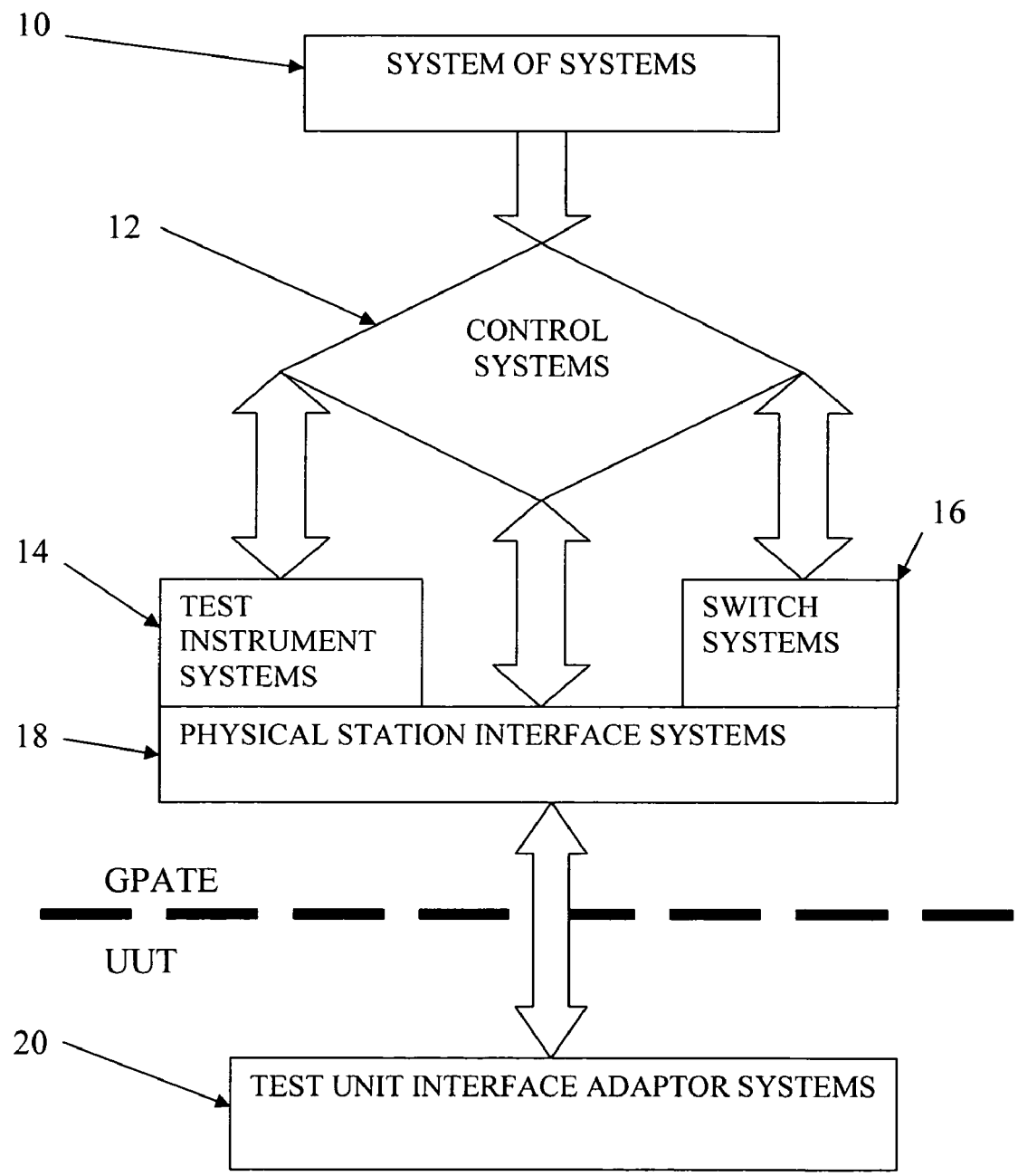
FIG. 1 is an illustration of a system of subsystems in accordance with the invention.

Referring to the accompanying drawings wherein like reference numerals refer to the same or similar elements, FIG. 1 illustrates the hierarchy of a system in accordance with the invention, i.e., a system of subsystems 10. The system of subsystems 10 includes one or more control systems 12 which controls test instrument systems 14, switch systems 16 and physical station interface systems 18. The physical station interface systems 18 are coupled to test unit interface adaptor systems 20. The system of subsystems 10 contains hardware and software components for which obsolescence mitigation is desired.

Figure 2:
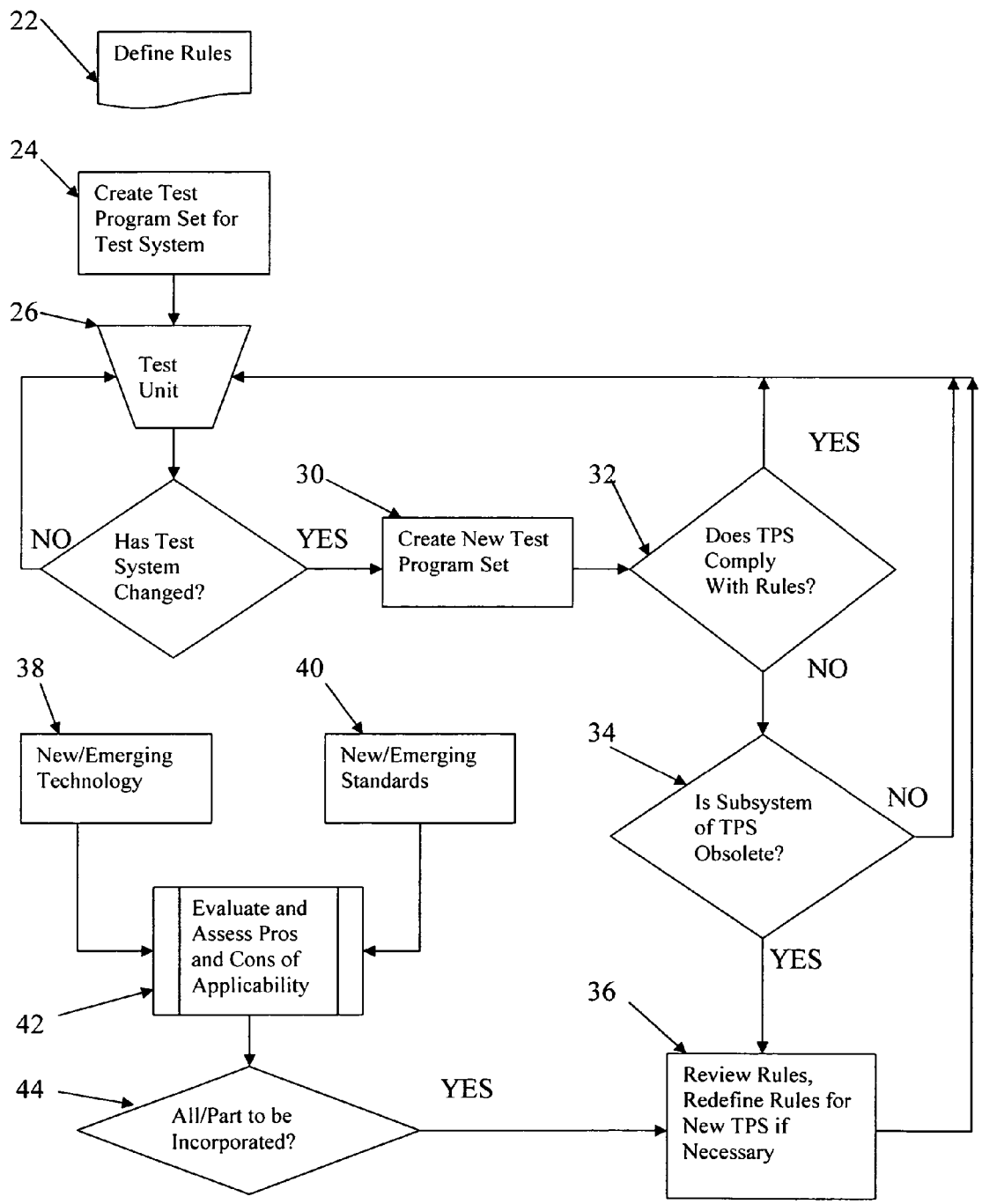
FIG. 2 is a flow chart of a method in accordance with the invention.

FIG. 2 shows a flow chart of one non-limiting method in accordance with the invention for designing and maintaining a system of subsystems, namely, an automated test system comprising hardware and software components and documentation. The method is effective on the system's hardware, software, documentation, development environments, support tools, test program development and test program acceptance methods to achieve transparent obsolescence for the end application.

The first step (22) in the method is to establish or define a set of governing rules for the system to be used over the entire life cycle of the system, i.e., over the entire life cycle of the automatic test system. These rules must be enforced throughout the use of the automatic test system in order to maintain the transparent obsolescence ability, i.e., the ability to remove, add and replace subsystems while maintaining the use of the remaining subsystems potentially in combination with new subsystems. If the rules are not enforced, transparent obsolescence may be precluded.

To establish effective rules, it is imperative not to overstate the importance of common sense when developing the rules, when adopting elements of standards, inserting new technology or replacing obsolete subsystems.

The rules are embodied in development documents for each subsystem. Such development documents are therefore created for each subsystem of the TPS. Fundamentally these documents define the critical interfaces and relationships required to produce transparent obsolescence of the system.

Once the rules are defined, a TPS is created for the particular test system (24) and units can be tested (26) in a conventional manner using the TPS. Such use continues until such time as new technology is developed which is deemed to be necessary, or desired, to use in the TPS. New technology may entail new hardware components or new software. The new subsystem is therefore inserted into the system and if an existing subsystem has been rendered redundant, i.e., the new subsystem is intended to replace the existing subsystem and assume its function if the same function is still needed in the system, then the existing subsystem is removed from the system.

Upon detection of a change in the test system (28), a new TPS is thereby created (30). A determination is made as to whether the new TPS complies with the defined rules (32) and if so, units can be tested using the new TPS. An example of new technology which would not require a new TPS may be replacement of a memory unit, i.e., a memory upgrade, replacement of a monitor, replacement of a microprocessor having a higher processing speed, or the addition of more memory. Such changes to the TPS will generally not result in the need for a new TPS.

However, if the new TPS does not comply with the current rules, a determination is made as to whether any subsystem of the TPS has been rendered obsolete (34). If not, units can be tested using the new TPS and the rules do not need to be redefined. On the other hand, if a subsystem of the TPS has been rendered obsolete, the rules are reviewed to ascertain the effect of the removal of the subsystem and possibly redefined to enable the new subsystem to be used in combination with the remaining subsystems (36).

Once the initial TPS has been created and used, when new/emerging technology (38) is developed or new/emerging standards (40) are promulgated, an evaluation of the technology and/or standards is made and an assessment of the advantages, disadvantages and applicability of each to the test system is made (42). A decision is made as to whether part or all of the new technology and/or standards is to be incorporated into the test system (44). If significant or meaningful advantages are not provided by the technology and/or standards or if the disadvantages outweigh the advantages, it is determined that none of the new technology and/or standards is to be incorporated into the test system and the test system is not updated, in which case the method ends. On the other hand, if all or part of the new technology and/or standards is to be incorporated into the test system, when the rules are reviewed for possible redefinition (36), the technology/standards to be incorporated is considered so that rules can accommodate test program sets using or applying the new technology and/or standards.

In order for a new subsystem to be incorporated into the system created by a method in accordance with the invention, it must not violate any existing rules and/or inherent relationships between any of the subsystems. Without a properly designed system of subsystems and a controlled core family of testers which adheres to the principals of this invention, it is currently not possible for multiple organizations to deliver end products that can achieve transparent obsolescence.

In accordance with the invention however, the method, systems and subsystems including logistic management are structured such that obsolescence of any element is transparent to the end use. This transparency produces cost avoidance savings independent of technology and standards employed.

Applying a method for designing and maintaining a system of subsystems as described above, a system of subsystems can be designed which incorporates multiple standards which mandate developmental practices for each subsystem within system. The method produces end products, i.e., test program sets, which are not impacted by any subsystem becoming obsolete and thus preserves the inherent value embodied in the test program set. The test program set, or test product, is integrated hardware, software and documentation which abides by the rules and satisfies the standards of the method.

An exemplifying test system to which the invention can be applied includes a computer system having interactive user interfaces and hardware or instrument interfaces. The computer system includes interactive user interfaces including, but not limited to, a graphical user interface (SVGA), a text message interface (PRN), a pointing device/keyboard interface (PS2), a pointing device/keyboard/multimedia interface (USB), an audio interface (SB), a footswitch/instrument control bus interface (Serial Bus), several instrument control bus interfaces (GPIB, MXI-2, MXI-3, MXI-4), an Internet/networking/instrument control bus (FTP) or LAN eXtension for Instrumentation (LXI), a peripheral control interface (ISA/EISA), an instrument control bus interface (PCI or PCI Express) and a hard drive/floppy drive/DVD drive interface (IDE/EIDE), as well as the hardware components associated with these interfaces, if any. The hardware or instrument interfaces typically include a general purpose instrument bus (GPIB) IEEE 488.2 Standard, a VME Extension for Instrument (VXI) bus Standard, a modular measurement system (MMS) bus, a PCI bus extension for VXI version 2 (MXI-2), a PCI bus extension for VXI version 3 (MXI-3), a file transfer protocol/Internet packet (FTP/IP), a firewire bus IEEE Standard, a Universal Serial Bus version 2.0 (USB) and a versa Modulo Extension (VME).

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A method for use of an electronic test system including hardware and software components while providing obsolescence mitigation, comprising:

defining a set of governing rules for the system;
creating, using a processor, at least a first test program test (TPS) for the system to enable units to be tested using the first TPS and the hardware and software components of the system when such units are coupled to the system;
storing the first TPS in memory accessible by a processor of the system;
coupling the units to the system and testing the units using a processor and the hardware and software components when the units are coupled to the system by executing the first TPS;
when a new component is sought to be introduced into the system, first determining whether the new component can be introduced while achieving transparent obsolescence mitigation for the first TPS and thereby enable continued use of the first TPS in a system including the new component by:
introducing the new component into the system;
creating, using a processor, a new TPS that interacts with the new component and any remaining components in the system without changing the remaining components in the system; and
determining, using a processor, whether the new TPS complies with the rules and
if so, considering the introduction of the new component into the system to be permissible while enabling continued use of the first TPS, and
if not, evaluating, using the processor, the effect of the new component on the system including advantages, disadvantages and applicability of the new component to the system and allowing or disallowing the introduction of the new component based on the evaluation; and after introduction of the component into the system and creation of the new TPS, enabling testing of units using the new TPS when such units are coupled to the system having the new component and any remaining components.

2. The method of claim 1, wherein the rules are used over the entire life cycle of the system, further comprising notifying a user of the system, via a display or user notification system, of a violation of the rules caused by the proposed introduction of a new component which might eliminate the transparent obsolescence mitigation.

3. The method of claim 1, further comprising embodying the rules in development documents for each component which define interfaces and relationships required to produce transparent obsolescence of the system, the development documents being embodied on computer-readable storage medium.

4. The method of claim 1, further comprises enabling introduction of the new component being introduced into the system into the system only when the new component does not violate any existing rules and/or inherent relationships between any of the other components in the system.

5. The method of claim 1, wherein the component being introduced into the system is a hardware component, and software components in the system are not changed upon introduction of the hardware component.

6. The method of claim 1, wherein the component proposed to be introduced into the system is a software component.

7. The method of claim 1, wherein the component proposed to be introduced into the system reflects a new or emerging technological innovation.

8. The method of claim 1, wherein the component proposed to be introduced into the system reflects a new or emerging standard.

9. The method of claim 1, further comprising, after the rules are reviewed to ascertain the effect of the removal of the component, redefining one or more of the rules to enable the new component to be used in combination with the remaining components in the system.

10. The method of claim 1, further comprises enabling introduction of the new component that is proposed to be introduced into the system only when the new component does not violate any existing rules and/or inherent relationships between any of the other components in the system.

11. The method of claim 1, further comprising automatically detecting a change in the system after introduction of the new component and creating the new TPS after the change in the system is detected.

12. The method of claim 1, wherein when the new TPS is determined not to comply with the rules, determining whether any component of the TPS has been rendered obsolete and if not, enabling testing of the units using the new TPS without redefining the rules; and when a component of the TPS has been rendered obsolete, reviewing the rules to ascertain the effect of the removal of the component.

13. The method of claim 12, further comprising removing the obsolete component from the system.

14. An electronic test system which provides for obsolescence mitigation, comprising:
hardware and software components selectively coupled together, said components including a processor and software embodied on computer-readable storage medium,
said components enabling creation of a first test program test (TPS) for the system and then after the first TPS has been created and stored, testing of units using the first TPS when such units are coupled to the system;
said software being designed to detect a change in the system caused by introduction of a new component into the system and then enable creation of a new TPS and determine whether the new TPS complies with a set of governing rules for the system to enable evaluation of the continued use of the new component in the system while achieving transparent obsolescence mitigation for the first TPS and thereby enable continued use of the first TPS in a system including the new component, the new TPS being created by said software to interact with the new component and any remaining components in the system without changing the remaining components in the system,
said hardware and software determining whether the new TPS complies with the rules and if so, the introduction of the new component into the system is considered to be permissible while enabling continued use of the first TPS, and if not, said hardware and software enables evaluation of the effect of the new component on the system including advantages, disadvantages and applicability of the new component to the system, the introduction of the new component into the system being allowed or disallowed based on the evaluation and after introduction of the component into the system and creation of the new TPS, enabling testing of units using the new TPS when such units are coupled to the system having the new component and any remaining components.

15. The system of claim 14, wherein said components include a LAN eXtension for Instrumentation (LXI) interface.

16. The system of claim 14, wherein said components include an instrument control bus interface (PCI Express).

17. The system of claim 14, wherein said components include a NxTest product.

18. The system of claim 14, wherein, after the rules are reviewed to ascertain the effect of the removal of the component, said software is designed to enable one or more of the rules to be redefined to enable the new component to be used in combination with the remaining components in the system.

19. The system of claim 14, wherein when the new TPS is determined to comply with the rules, said components being enabled to initiate testing of units using the new TPS when such units are coupled to the system, and when the new TPS is determined not to comply with the rules, said software being designed to determine whether any component of the TPS has been rendered obsolete and if not, enable said components to initiate testing of the units using the new TPS without redefining the rules and when such units are coupled to the system, and when a component of the TPS has been rendered obsolete, said software being designed to review the rules to ascertain the effect of the removal of the obsolete component.

\* \* \* \* \*

UNITED STATES PATENT AND TRADEMARK OFFICE
CERTIFICATE OF CORRECTION

PATENT NO. : 7,624,379 B2
APPLICATION NO. : 11/330702
DATED : November 24, 2009
INVENTOR(S) : Robert Spinner It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 988 days.

Signed and Sealed this

Twenty-sixth Day of October, 2010

David J. Kappos
*Director of the United States Patent and Trademark Office*